(12) United States Patent
Toyota et al.

(10) Patent No.: US 12,385,130 B2
(45) Date of Patent: Aug. 12, 2025

(54) DEVICE FOR FORMING DIAMOND FILM ETC. AND METHOD THEREFOR

(71) Applicants: NATIONAL UNIVERSITY CORPORATION EHIME UNIVERSITY, Matsuyama (JP); GROWTH CO., LTD., Osaka (JP)

(72) Inventors: Hiromichi Toyota, Matsuyama (JP); Shinfuku Nomura, Matsuyama (JP); Toshiyuki Shimada, Osaka (JP)

(73) Assignees: National University Corporation Ehime University, Matsuyama (JP); Growth Co., Ltd., Osaka (JP)

( * ) Notice: Subject to any disclaimer, the term of this patent is extended or adjusted under 35 U.S.C. 154(b) by 1219 days.

(21) Appl. No.: 16/958,415

(22) PCT Filed: Dec. 26, 2018

(86) PCT No.: PCT/JP2018/047886
§ 371 (c)(1),
(2) Date: Jan. 6, 2021

(87) PCT Pub. No.: WO2019/131777
PCT Pub. Date: Jul. 4, 2019

(65) Prior Publication Data
US 2021/0140039 A1    May 13, 2021

(30) Foreign Application Priority Data
Dec. 28, 2017   (JP) .................................. 2017-253939

(51) Int. Cl.
C23C 16/27       (2006.01)
C23C 16/513      (2006.01)
(Continued)

(52) U.S. Cl.
CPC .......... *C23C 16/276* (2013.01); *C23C 16/513* (2013.01); *C30B 25/02* (2013.01);
(Continued)

(58) Field of Classification Search
CPC ..... C23C 16/276; C23C 16/513; C30B 25/02; C30B 29/04; H01L 21/02527;
(Continued)

(56) References Cited

U.S. PATENT DOCUMENTS 6,745,717 B2 *   6/2004   Doak ................ H01L 21/02381
                                                        250/492.23
8,893,651 B1 *  11/2014   Biberger ................... A61L 2/18
                                                           118/723 DC
(Continued)

FOREIGN PATENT DOCUMENTS

CA       2880100 A1 *   1/2014  ............. E21B 28/00
CN      101209815 A  *   7/2008
(Continued)

OTHER PUBLICATIONS

English Translation of the International Preliminary Report on Patentability for International (PCT) Patent Application No. PCT/JP2018/047886, dated Jul. 9, 2020, 9 pages.
(Continued)

*Primary Examiner* — Jeffrie R Lund
(74) *Attorney, Agent, or Firm* — Sheridan Ross, PC

(57) ABSTRACT

According to an embodiment of the present invention, there is provided a device for forming at least a diamond film on a surface of a substrate, the device comprising: a container configured to hold a raw material liquid and to place the substrate in the raw material liquid; an electrode part comprising a positive electrode and a negative electrode and configured to generate a plasma in the raw material liquid; a raw material gas supply part and a carrier gas supply part,
(Continued)

each of the raw material gas supply part and the carrier gas supply part being connected to the electrode part; and a power source configured to apply a voltage to the electrode part, wherein the power source is a direct current power source, and the electrode part further comprises an adjunctive member, and the adjunctive member is attached to an electrode at a plasma generation region of the electrode part.

18 Claims, 9 Drawing Sheets

(51) Int. Cl.
  C30B 25/02    (2006.01)
  C30B 29/04    (2006.01)
  H01L 21/02    (2006.01)
  H05H 1/24     (2006.01)
  H10D 62/83    (2025.01)

(52) U.S. Cl.
  CPC ........ *C30B 29/04* (2013.01); *H01L 21/02527* (2013.01); *H01L 21/0262* (2013.01); *H05H 1/247* (2021.05); *H10D 62/8303* (2025.01)

(58) Field of Classification Search
  CPC ............. H01L 21/0262; H01L 29/1602; H01L 21/02381; H05H 1/247; C01B 32/26
  See application file for complete search history.

(56) References Cited

U.S. PATENT DOCUMENTS

| | | | |
|---|---|---|---|
| 12,203,902 B2 * | 1/2025 | Safai | G01N 29/043 |
| 2006/0213428 A1 | 9/2006 | Meguro et al. | |
| 2008/0124198 A1 * | 5/2008 | Kim | H01L 21/67092 414/217.1 |
| 2009/0200157 A1 * | 8/2009 | Nomura | B01J 19/126 204/157.47 |
| 2010/0178730 A1 | 7/2010 | Noguchi | |
| 2010/0209311 A1 * | 8/2010 | Mills | G21B 3/00 422/186.04 |
| 2011/0227347 A1 * | 9/2011 | Chae | F02G 1/055 60/516 |
| 2016/0243517 A1 | 8/2016 | Kitada et al. | |
| 2018/0049304 A1 | 2/2018 | Kim et al. | |
| 2018/0208464 A1 * | 7/2018 | Cha | H05H 1/26 |
| 2021/0140039 A1 * | 5/2021 | Toyota | C23C 16/276 |
| 2024/0344948 A1 * | 10/2024 | Safai | H05H 1/247 |
| 2025/0011922 A1 | 1/2025 | Toyota et al. | |

FOREIGN PATENT DOCUMENTS

| | | | | |
|---|---|---|---|---|
| CN | 101252804 A | * | 8/2008 | |
| CN | 105102168 B | * | 12/2019 | ............. C23C 4/134 |
| EP | 0111291 | | 6/1984 | |
| JP | S54-035192 | | 3/1979 | |
| JP | S59-112249 | | 6/1984 | |
| JP | S6064426 A | * | 4/1985 | |
| JP | H03-61373 | | 3/1991 | |
| JP | H06-135797 | | 5/1994 | |
| JP | H8337804 | * | 12/1996 | |
| JP | 2001508124 A | * | 1/2001 | |
| JP | 2005-235662 | | 9/2005 | |
| JP | 2006-335637 | | 12/2006 | |
| JP | 2008-150246 | | 7/2008 | |
| JP | 2010-159465 | | 7/2010 | |
| JP | 2010-177002 | | 8/2010 | |
| JP | 2010177002 A | * | 8/2010 | |
| JP | 2013-251367 | | 12/2013 | |
| JP | 2015-056407 | | 3/2015 | |
| JP | 2016-155058 | | 9/2016 | |
| JP | 2016156049 A | * | 9/2016 | |
| JP | 2018162520 A | * | 10/2018 | ............... B05B 7/22 |
| JP | 2019-116402 | | 7/2019 | |
| KR | 20050113755 A | * | 12/2005 | |
| KR | 20170017602 A | * | 2/2017 | |
| WO | WO-9218664 A1 | * | 10/1992 | ........... C23C 16/276 |
| WO | WO 2016/136669 | | 9/2016 | |

OTHER PUBLICATIONS

International Search Report and Written Opinion for International (PCT) Patent Application No. PCT/JP2018/047886, dated Mar. 5, 2019, 10 pages.

Translated International Search Report for International (PCT) Patent Application No. PCT/JP2018/047886, dated Mar. 5, 2019, 2 pages.

Damm et al. "Interlayers Applied to CVD Diamond Deposition on Steel Substrate: A Review," Coatings, Sep. 2017, vol. 7, No. 9, Article 141, 26 pages.

Toyota et al. "An influence of the thermal expansion of the substrate on the diamond deposition using in-liquid plasma CVD method," 48th National Heat Transfer Symposium of Japan 2011, May 2011, vol. II + III, pp. 1232 (English abstract).

* cited by examiner

DEVICE FOR FORMING DIAMOND FILM ETC. AND METHOD THEREFOR

CROSS REFERENCE TO RELATED APPLICATIONS

This application is a national stage application under 35 U.S.C. 371 and claims the benefit of PCT Application No. PCT/JP2018/047886 having an international filing date of 26 Dec. 2018, which designated the United States, which PCT application claimed the benefit of Japan Patent Application No. 2017-253939 filed 28 Dec. 2017, the disclosures of each of which are incorporated herein by reference in their entireties.

TECHNICAL FIELD

The disclosure relates to a device for forming a diamond film etc. and a method therefor.

BACKGROUND OF THE INVENTION

A vapor phase synthesis method has been known as a method for forming a diamond film. The vapor phase synthesis method has had technical problems that "a formation rate of the diamond film is slow" and "there is necessary to form the diamond film in a chamber under a high pressure condition" for example. In light of the above matters, an attempt has already been made to generate a plasma P' in a raw material liquid under an use condition of a high frequency power source 70', thereby forming a diamond film on a substrate 30' (see FIG. 4).

PATENT DOCUMENTS (RELATED ART PATENT DOCUMENTS)

PATENT DOCUMENT 1: Japanese Unexamined Patent Application Publication No. 2008-150246

DISCLOSURE OF THE INVENTION

Problems to be Solved by the Invention

The inventors of the present application have found that there is still a technical problem to be overcome when using a conventional device for forming the diamond film, and that there is necessary to solve the technical problem. Specifically, the inventors of the present application have found that there is the following technical problem.

In an embodiment in which the plasma P' is generated in the raw material liquid 20' under the use condition of the high frequency power source 70' as a component of the device for forming the diamond film, a structure of the device may be complicated and it may take a relatively high cost to supply a high power. Thus, an introduction of a direct current power source is desired to make the structure of the device simple and to supply the high power at a low cost.

In a case of an use of the direct current power source, however, a plasma may be in a very high temperature state, the plasma being formed by applying a voltage to electrodes, as compared with a case of an use of the high frequency power source 70'. A temperature of the plasma is 4000K upon the use of the high frequency power source, whereas a temperature of the plasma is 7000K to 10000K upon the use of the direct current power source.

When the plasma is in the very high temperature state, the electrode, particularly the positive electrode, may be excessively heated and thus the electrode may be melted. A melting of the electrode may make a suitable formation of a target (i.e., diamond) impossible, the target being formed on the substrate 30' by a plasma irradiation.

In light of the above matters, it seems that the skilled person may avoid the use of the direct current power source as the power source for generating the plasma in a liquid. In this regard, the direct current power source has advantages that the structure of the device can be simplified and the high power can be supplied at the low cost. Thus, an effective use of the direct current power source having the above advantages may be desired.

Under these circumstances, an object of the present invention is to provide a device for forming a diamond and a method therefor, the device and the method being capable of preventing an electrode melting which may occur in a case of an use of a direct current power source.

Means for Solving the Problems

In order to achieve the above object, an embodiment of the present invention provides a device for forming at least a diamond film on a surface of a substrate, the device comprising:
  a container configured to hold a raw material liquid and to place the substrate in the raw material liquid;
  an electrode part comprising a positive electrode and a negative electrode and configured to generate a plasma in the raw material liquid;
  a raw material gas supply part and a carrier gas supply part, each of the raw material gas supply part and the carrier gas supply part being connected to the electrode part; and
  a power source configured to apply a voltage to the electrode part,
  wherein the power source is a direct current power source, and the electrode part further comprises an adjunctive member, and the adjunctive member is attached to an electrode at a plasma generation region of the electrode part.

In order to achieve the above object, an embodiment of the present invention also provides a method for forming at least a diamond film on a surface of a substrate, the method comprising:
  placing the substrate in a container and holding a raw material liquid in the container in which the substrate is placed;
  supplying a raw material gas and a carrier gas into an electrode part, the electrode part comprising a positive electrode and a negative electrode and a tip portion of the electrode part being located in the raw material liquid;
  applying a voltage to the electrode part by a power source to generate a plasma at the tip portion of the electrode part, wherein a direct current power source is used as the power source, and the electrode part further comprising an adjunctive member is used, and the adjunctive member is attached to an electrode at a plasma generation region of the electrode part.

Effect of the Invention

According to an embodiment of the present invention, it is possible to prevent the above electrode melting which may occur in the case of the use of the direct current power source. Accordingly, it is possible to suitably form the diamond film on the surface of the substrate even the case where the direct current power source is used as a power source.

MODES FOR CARRYING OUT THE INVENTION

Figure 1:
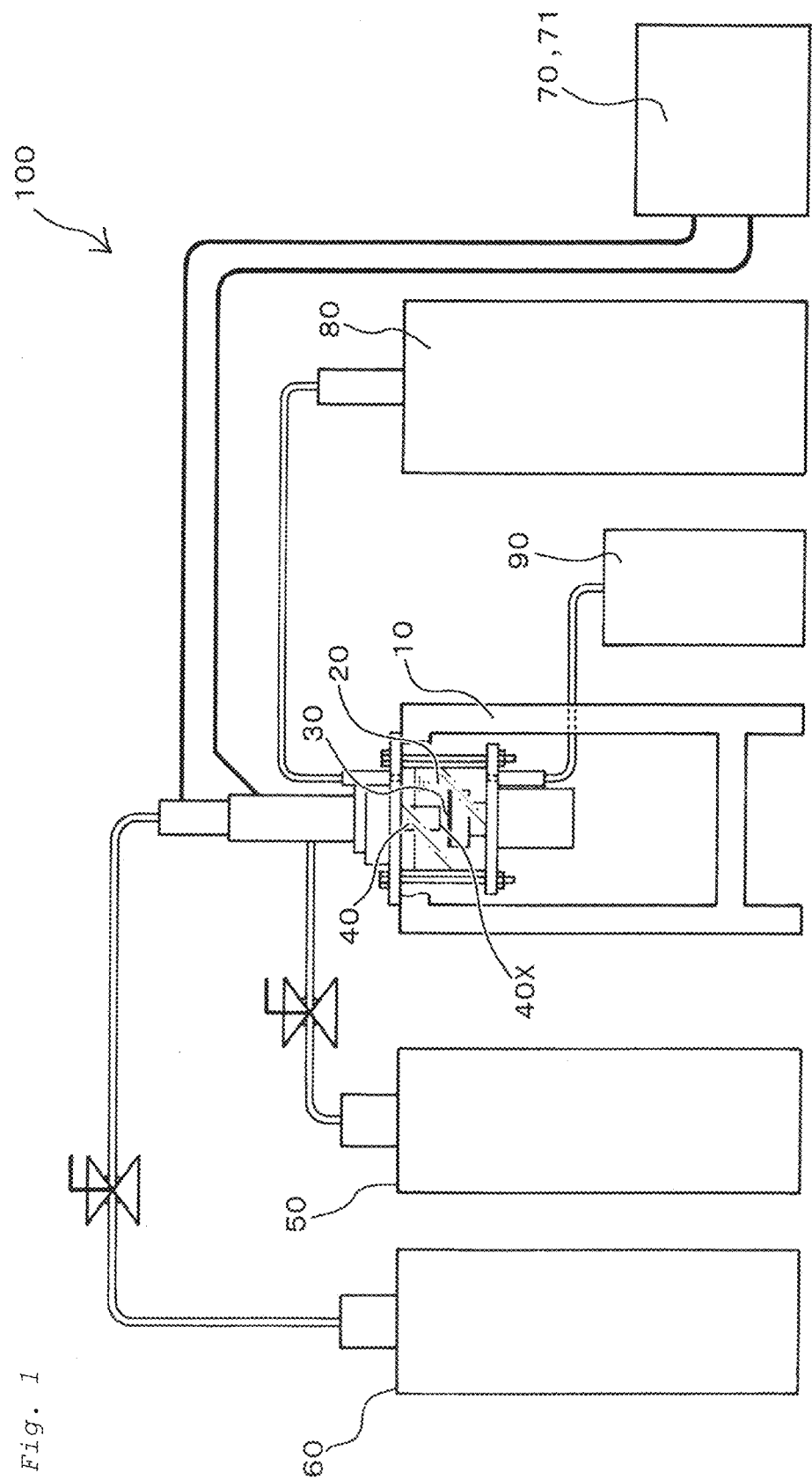
FIG. 1 is a cross-sectional view schematically showing a device for forming a diamond film according to an embodiment of the present invention.

Hereinafter, a device for forming a diamond film according to an embodiment of the present invention will be described. Before describing a configuration of the device for forming the diamond film according to an embodiment of the present invention, matters resulting in a creation of the present invention will be described.
(Matters Resulting in Creation of Present Invention)
As described above, the inventors of the present application have found that an use of a high-frequency power source is common to the skilled person, the high-frequency power source being a power source which is a component of a conventional device for forming a diamond film, whereas an use of a direct current power source is not common to the skilled person. These matters are based on the following contents. In a case where the direct current power source is used as the power source for the device for forming the diamond film, a plasma is in a very high temperature state as compared with a plasma in a case of an use of the high frequency power source, the plasma being formed by applying a voltage to an electrode. Thus, the electrode is excessively heated, which may cause a melting of the electrode. Such the melting of the electrode may interfere with a suitable diamond formation on a substrate by a plasma irradiation. In light of the above matters, the inventors of the present application have considered that the skilled person may avoid the use of the direct current power source as the power source for generating the plasma in a liquid. In this regard, the direct current power source has advantages that the structure of the device can be simplified and the high power can be supplied at the low cost.

Thus, the inventors of the present application have consciously focused on an effective availability of the direct current power source which is considered to be not common to the skilled person, and have created the present invention to achieve the effective availability of the direct current power source. That is, the present invention has been created in accordance with a technical idea on how to achieve an use of the direct current power source which is considered to be not common to the skilled person. On the other hand, the conventional art has such a technical idea that an use of the direct current power source as the power source of the device may eventually interfere with a suitable diamond formation. Namely, the conventional technical idea contradicts the technical idea on how to achieve the use of the direct current power source. In light of the above matters, the present invention has been newly created by the inventors of the present application despite an existence of a contradiction relationship. In this respect, the present invention has a technical significance.

As can be seen from the above, a newly consideration itself on the availability of the direct current power source has a technical significance, the newly consideration on the availability of the direct current power source contradicting the conventional technical idea of the skilled person. In this regard, it is necessary to overcome a newly found technical problem that "the electrode is melted due to an exposure to a plasma atmosphere in the very high temperature state" to achieve the use of the direct current power source. The inventors of the present application have earnestly studied a solution to the technical problem newly found, and as a result, have created the present invention. From a viewpoint of overcoming the above technical problem, the inventors of the present application have found that an adjunctive member or an additional member is newly incorporated into the electrode part.
(Specific Configuration of Present Invention)
Hereinafter, a configuration of the device for forming the diamond film according to an embodiment of the present invention will be described with reference to the drawings.

Figure 2:
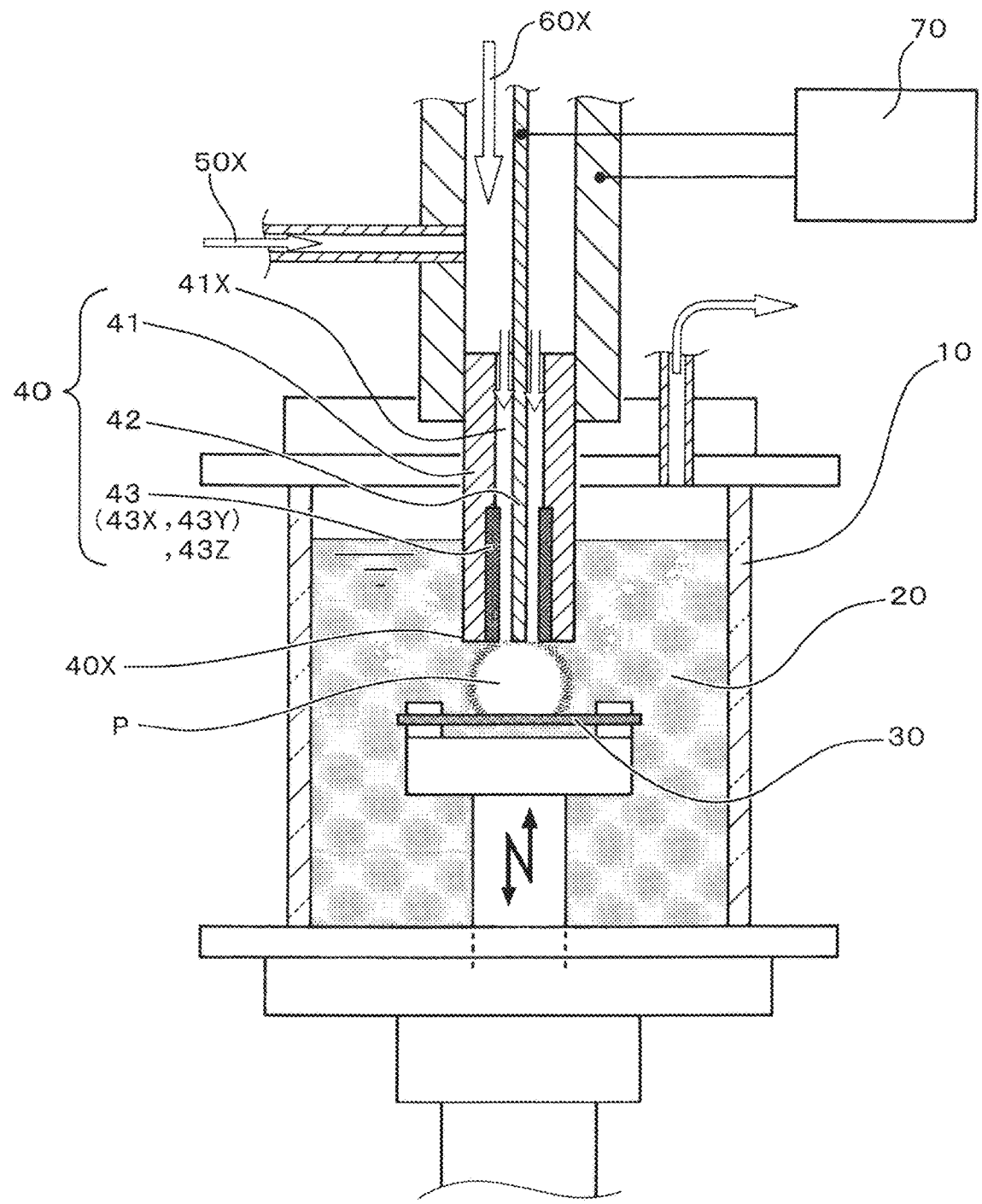
FIG. 2 is an enlarged cross-sectional view schematically showing an electrode part and a peripheral member in a vicinity of the electrode part, the electrode and the peripheral member being components of a device for forming a diamond film according to an embodiment of the present invention.
Figure 3:
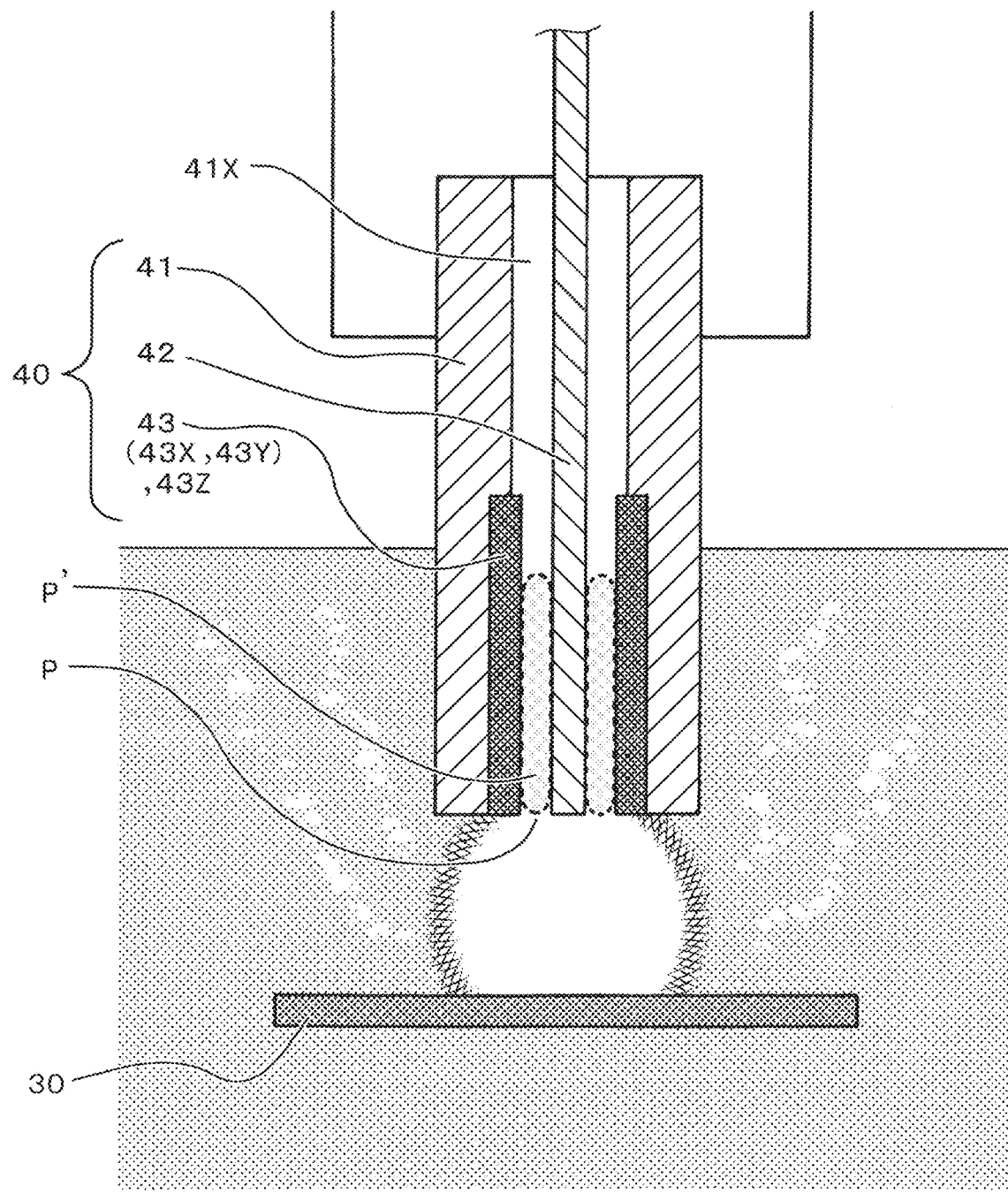
FIG. 3 is an enlarged cross-sectional view schematically showing an electrode part which is a component of a device for forming a diamond film according to an embodiment of the present invention.
Figure 4:
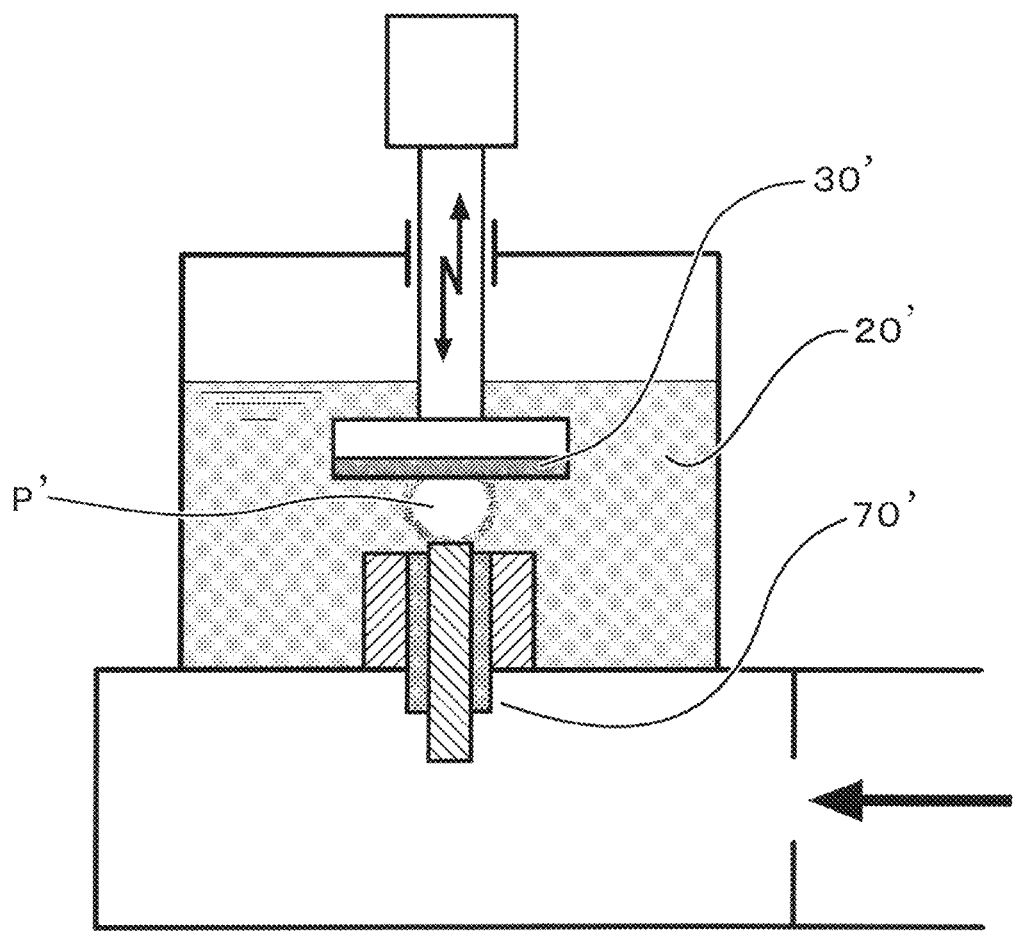
FIG. 4 is a cross-sectional view schematically showing a conventional device for forming a diamond film, the conventional device including a high frequency power source.

FIG. 1 is a cross-sectional view schematically showing the device for forming the diamond film according to an embodiment of the present invention. FIG. 2 is an enlarged cross-sectional view schematically showing an electrode part and a peripheral member in a vicinity of the electrode part, the electrode and the peripheral member being components of the device for forming the diamond film according to an embodiment of the present invention. FIG. 3 is an enlarged cross-sectional view schematically showing an electrode part which is a component of the device for forming the diamond film according to an embodiment of the present invention.

The device for forming the diamond film 100 according to an embodiment of the present invention includes the following components as shown in FIG. 1. Specifically, the device for forming the diamond film 100 according to an embodiment of the present invention includes a container 10, an electrode part 40, a raw material gas supply part 50 and a carrier gas supply part 60, a power source or a power supply 70, a gas cooling part 80, and a liquid tank 90.

The container 10 is configured to hold the raw material liquid 20 and to place a substrate 30 in the raw material liquid 20. The raw material liquid 20 may be a liquid having the same composition as that of a raw material gas 50X from a viewpoint of more suitably providing a carbon source necessary for forming a diamond film as described later. Without being limited to the above matters, the raw material liquid 20 may be composed of water from a viewpoint of only cooling a tip portion 40X of the electrode part 40, the tip portion 40X being positioned in the raw material liquid 20. The substrate 30 is a member serving as a base or a mounting for forming a diamond film on a surface (i.e., an upper surface) of the substrate 30, and the substrate 30 is made of a cemented carbide alloy, silicon, or the like. The cemented carbide alloy as described herein is a material made by mixing tungsten carbide (WC) and cobalt (Co) as a binder and subsequently sintering a mixture thereof. Titanium carbide (TiC) or the like may be added in terms of a further improvement of a material property.

The electrode part 40 includes a positive electrode 41 and a negative electrode 42, and is a part configured to generate a plasma P in the raw material liquid 20 in a state where a voltage is applied. A composition material of the positive electrode 41 may be a Cu-based material, and a composition material of the negative electrode 42 may be a W-based material. The electrode part 40 serving to generate the plasma P in the raw material liquid 20 is configured such that at least a tip portion of the electrode part 40 is positioned in the raw material liquid 20. While not being particularly limited, the positive electrode 41 may have a tubular structure having an internal space region 41X. When the tubular structure is adopted, a receiving part can be further provided, the receiving part serving to receive a part of the positive electrode 41 having the tubular structure. While not being particularly limited, the receiving part and the raw material gas supply part 50 may be connected via a raw material gas supply pipe. Further, the receiving part and the carrier gas supply part 60 may be connected via a carrier gas supply pipe. On the other hand, the negative electrode 42 may have a structure in a shape of a rod or column and a structure capable of extending in the internal space region 41X of the positive electrode 41. Due to the structure, a plasma P generation region is provided between the positive electrode 41 having the tubular structure and the negative electrode 42 in the shape of rod and extending in the internal space region 41X of the positive electrode 41. Furthermore, in order to facilitate the plasma P to more suitably provide a carbon source to the substrate 30, the carbon source being a source at least necessary for forming a diamond film described later, the electrode part 40 is positioned vertically above the substrate 30 and adjacent to the substrate 30 such that the electrode part 40 and the substrate 30 are opposed to or faced to each other. In other words, the substrate 30 is positioned vertically below the electrode part 40 (i.e., in a gravitational direction thereof) and adjacent to the electrode part 40. A distance between the electrode part 40 and the substrate 30 may be 0.5 mm to 3.0 mm, preferably 1.0 mm to 2.5 mm, more preferably 1.5 mm to 2.0 mm to be able to directly irradiate the substrate 30 with a generated plasma P.

The raw material gas supply part 50 is connected to the electrode part 40 such that a raw material gas 50X can be supplied to the electrode part 40. The raw material gas supply part 50 corresponds to a pressure vessel serving to heat and vaporize a solution which is a source of the raw material gas. The carrier gas supply part 60 is connected to the electrode part 40 such that a carrier gas 60X can be supplied to the electrode part 40. The power source 70 serves to apply a voltage to the electrode part 40. A direct current power source 71 is used as the power source 70 according to an embodiment of the present invention.

When the raw material gas 50X and the carrier gas 60X are supplied into the electrode part 40 in a state where the voltage is applied to the electrode part 40 (that is, a potential difference generation state), a plasma state is formed due to each gas. Specifically, when each gas is supplied into the electrode part 40 in the state where the voltage is applied to the electrode part 40, each of molecules of the raw material gas 50X and molecules of the carrier gas 60X is ionized between the electrodes, which causes a motion state in which each gas is divided into ions and electrons. The Plasma P is generated in this motion state. In an embodiment, helium gas, neon gas, argon gas, nitrogen gas, or the like may be used as the carrier gas 60X. A liquid containing a carbon source may be used as a solution which is a source of the raw material gas 50X.

(Method for forming diamond film etc.)

When the device 100 for forming the diamond film etc. having the above components is used, at least the diamond film can be formed on the surface of the substrate 30 by performing at least the following steps:

placing the substrate 30 in the container 10 and holding the raw material liquid 20 in the container 10 in which the substrate 30 is placed;

supplying the raw material gas 50X and the carrier gas 60X into the electrode part 40, the electrode part 40 including the positive electrode 41 and the negative electrode 42 and a tip portion 40X of the electrode part 40 being located in the raw material liquid 20; and applying the voltage to the electrode part 40 by the power source 70 (i.e., direct current power source 71) to generate the plasma P at the tip portion 40X of the electrode part 40.

As described above, when the raw material gas 50X and the carrier gas 60X are supplied into the electrode part 40 in the state where the voltage is applied to the electrode part 40, each of molecules of the raw material gas 50X and molecules of the carrier gas 60X is ionized between the electrodes, which causes the motion state in which each gas is divided into ions and electrons. The Plasma P is generated in this motion state. When the plasma P is generated due to the carrier gas 60X and the raw material gas 50X, a heat of the plasma P causes at least the carbon source (i.e., C source) in the raw material gas 50X to be extracted. As described above, the substrate 30 can be directly irradiated with the plasma P, which may cause the extracted carbon source to be supplied or provided on a surface (particularly on an upper surface) of the substrate 30, the substrate 30 being positioned vertically below the electrode part 40 and adjacent to the electrode part 40. A supply of the carbon source on the surface (particularly the upper surface) of the substrate 30 enables the diamond film to be formed on the substrate 30.

As can be seen from the following examples, from a viewpoint of a suitable formation of the diamond film, a combination of methanol (90% or more by volume) and ethanol (10% or less by volume) can be used as a liquid containing the carbon source. Without being limited to this, the liquid containing the carbon source may contain water. As can be seen in the following examples, when a substrate made of cemented carbide was used as the substrate 30, it was newly discovered that the diamond film due to the carbon source on most of the main surface of the substrate 30 was formed and also a fibrous carbon nanotube (i.e., CNT) was formed on a part of the main surface of the substrate 30. It has been known that the carbon nanotube (CNT) can be synthesized by using Co particles as a catalyst. In this regard, the cemented carbide contains Co as a binder as described above. As a result, the inventors of the present application have found that Co is dissolved from the substrate 30 and the dissolved Co is formed into particles upon an irradiation of the substrate 30 with the plasma P, and a formation of the carbon nanotube (CNT) results from the carbon source of the raw material gas 50X in a condition of an use of the Co as the catalyst, the carbon source being extracted from the raw material gas 50X using the plasma P.

Furthermore, it is preferable that the above forming method adopts the following embodiments.

According to an embodiment, it is preferable that each of a first plasma generated using the carrier gas 60X and a second plasma generated using the raw material gas 50X is supplied from a plasma P generation region to the substrate 30, and the first plasma is supplied to the substrate 30 before a supply of the second plasma to the substrate 30.

It has already been known that, upon an irradiation of the surface (i.e., upper surface) of the substrate 30 with the plasma P, it is preferable that the substrate 30 which is a part to be irradiated is pre-heated from a viewpoint of a suitable formation of the diamond film. A conventional technical recognition of the skilled person is that "the substrate is heated by using an external heating source". In this regard, an embodiment in which the external heating source is not used has been earnestly studied in view of "a reduction for an overall size of the device for forming the diamond film etc. 100 and a simplification for a configuration of the device 100". As a result, the inventors of the present application have found that a plasma due to the carrier gas is intentionally formed earlier, not a conventional simultaneous supply of the source gas 50X and the carrier gas 60X, and then a high temperature heat of the earlier formed plasma is transferred to the substrate 30. According to this embodiment, it is possible to heat the substrate 30 with no use of the external heating source before supplying the carbon source to the substrate 30 to form the diamond film, the carbon source being derived from the raw material gas. As a result, it is possible to suitably form the diamond film with no use of the external heating source. In this respect, this embodiment is characteristic in terms of a process.

(Introduction of Adjunctive Member)

The inventors of the present application have earnestly studied the solution to the technical problem that, upon the use of the direct current power source 71 as the power source 70, the electrode part 40 is exposed into the plasma P in the very high temperature state, which may cause the electrode to be melted, the technical problem being found by the inventors of the present application. As a result, the inventors of the present application have created the electrode part 40 having a characteristic configuration, the electrode part being the component of the device 100 for forming the diamond film, etc. Specifically, as shown in FIG. 2, in addition to the positive electrode 41 and the negative electrode 42, an adjunctive member 43 is newly introduced as a component of the electrode part 40 which is exposed to an atmosphere of the plasma P in the very high temperature state. The phrase "adjunctive member" as used herein means a member adjunctively or additionally provided as a new component of the electrode part. As shown in FIG. 2, the adjunctive member 43 is attached to the electrode at a plasma P generation region of the electrode portion 40. That is, the adjunctive member 43 can be an attachment member 43X additionally attached to the electrode at the plasma P generation region. On the other hand, the conventional diamond film forming device has no technical idea that the adjunctive member is "intentionally" introduced as a new component of the electrode part in addition to the positive electrode and the negative electrode. In this respect, the device for forming the diamond film according to an embodiment of the present invention has a characteristic configuration as compared with the conventional embodiment.

(Function of Adjunctive Member: Protection of Electrode Itself at Plasma Generation Region)

The fact that the adjunctive member 43 is adjunctively or additionally attached to the electrode at the plasma P generation region means that the electrode at the plasma P generation region is covered with the adjunctive member 43. That is, the covering enables the adjunctive member 43 to function as a protective member for the electrode itself at the plasma P generation region. Thus, it is possible to suitably avoid a direct exposure of the electrode located immediately below the adjunctive member 43 to the plasma P. Accordingly, an avoidance of the direct exposure enables a melting of the electrode to be suitably prevented, the melting of the electrode being due to the exposure of the electrode part 40 to the plasma P in the very high temperature state.

(Function of Adjunctive Member: Prevention of Electrode Melting at Plasma Generation Region)

In light of the above technical effect "suitable prevention of the electrode melting" due to the exposure of the electrode part 40 to the plasma P in the very high temperature state, the adjunctive member 43 can function as a melting prevention member for the electrode 43Y. The phrase "melting prevention member for the electrode" used herein means a member serving to prevent the melting of the electrode which is a component of the electrode part. On the other hand, the conventional diamond film forming device has no technical idea that a melting prevention member for an electrode is "intentionally" further introduced, the melting prevention member being a component of the electrode part. In this respect, the device for forming the diamond film according to an embodiment of the present invention has a characteristic configuration as compared with the conventional embodiment.

(Function of Adjunctive Member: Supply of Impurity)

The inventors of the present application have found that, in a case where the adjunctive member 43 is newly introduced as a component of the electrode part 40, the adjunctive member 43 itself is exposed to a high-temperature heat atmosphere of the plasma, which may cause a part of the adjunctive member 43 to be melted. It is conceivable that the heat of the plasma P may cause the carbon source (i.e., C source) in the raw material gas 50X to be extracted, and also the melting of the part of the adjunctive member may cause an occurrence of an impurity derived from a composition material of the adjunctive member 43. Namely, the adjunctive member 43 can function as an impurity supply source member 43Z. The phrase "impurity supply source member" used herein means a member serving as a supply source of an impurity to a surface side of the substrate. A direct irradiation of the generated plasma P to the substrate 30 is possible. Thus, it is possible to supply the extracted carbon source and the impurity derived from the composition material of the adjunctive member 43 to the surface (particularly upper surface) side of the substrate 30.

It has been known that an addition of a small amount of impurity such as phosphorus to a Si film enable a physical property of the Si film to be changed, which makes a formation of a desired Si semiconductor possible. This means that the skilled person's understanding is that it is necessary to add the small amount of the impurity to the film to obtain a desired semiconductor. In recent years, an use of a diamond-based film instead of Si-based film or substrate has been started, the diamond-based film having a high resistance to an external environment. In light of the above matters, it is conceivable that the addition of the small amount of the impurity such as phosphorus to the diamond film enables the physical property of the diamond film to be changed, thereby forming a desired diamond semiconductor.

As described above, according to an embodiment of the present invention, the substrate 30 as the base can be directly irradiated with the plasma P, which makes it possible to supply the extracted carbon source and the impurity to the surface side of the substrate 30, the impurity being derived from the composition material of the adjunctive member 43. That is, according to the present invention, it is possible to supply not only the carbon source which can directly contribute to the formation of the diamond film, but also the impurity derived from the composition material of the adjunctive member 43 to the substrate 30 side at the "same timing". This means that a same timing-supply of the carbon source and the impurities enables a film to be formed on the substrate 30 without a conventional step of separately adding a small amount of an impurity to a diamond film. Namely, an existence of the impurity as well as the carbon source at the same timing may enable a change of a physical property of the diamond film to be obtained, without the conventional step of separately adding the small amount of the impurity to the diamond film. Accordingly, according to an embodiment of the present invention, there is a possibility that a diamond semiconductor having a semiconductor characteristic can be finally formed without separately adding the small amount of the impurity to the diamond film. The impurity necessary for forming a suitable semiconductor can be referred to as a "dopant". While not particularly limited, phosphorus, arsenic, antimony, boron, gallium, or the like, which may serve as the dopant of the semiconductor, can be used as a composition material included in the adjunctive member 43.

Furthermore, it is preferable that the above adjunctive member 43 adopts the following embodiments.

According to an embodiment, it is preferable that the adjunctive member 43 is located at a tip portion 40X of the electrode part 40.

A large amount of plasma P may be generated on a tip 40X side of the electrode part 40. In view of this point, it is preferable that the adjunctive member 43 is located at a tip portion 40X side of the electrode part 40. Thus, the tip portion 40X of the electrode part 40 is covered with the adjunctive member, which enables the adjunctive member 43 to function as a protective member for the tip portion 40X itself of the electrode part 40, the tip portion 40X being located in the plasma P generation region. As a result, the adjunctive member 43 makes it possible to avoid a direct exposure of the tip portion 40X of the electrode part 40 to the plasma P, the tip portion 40X being located immediately below the adjunctive member 43. An avoidance of the direct exposure of the tip portion makes it possible to suitably prevent a melting of the tip portion 40X of the electrode part 40, the melting of the tip portion 40X being caused by the exposure of the tip portion 40X to a relatively large amount of the plasma P in the extremely high temperature state.

Furthermore, the relatively large amount of the plasma P may be generated at the tip portion 40X side of the electrode part 40. Thus, in a case where the adjunctive member 43 is arranged at the tip portion 40X, a heat of the plasma P may cause a part of the adjunctive member 43 covering the tip portion 40X to be melted. The melting of the part of the adjunctive member 43 may cause the occurrence of the impurity as described above, the impurity being derived from the composition material of the adjunctive member 43. The substrate 30 can be directly irradiated with the plasma P, which makes it possible to supply the impurity as well as the carbon source to the surface side of the substrate 30, the impurity being derived from the composition material of the adjunctive member 43. As a result, the impurity as well as the carbon source can exist at the same timing, which may finally lead to a formation of the diamond semiconductor having the semiconductor characteristic.

According to an embodiment, it is preferable that the adjunctive member 43 is located on a surface of the positive electrode 41 at the plasma P generation region.

With regard to a relationship between a melting point and a boiling point of a constituent element of one of electrodes and those of other of electrodes, the electrodes being components of the electrode part 40, the technical knowledge of the skilled person is that the melting point and the boiling point of the constituent element of the one of the electrodes are different from those of the other of the electrodes. As an example, the melting point and boiling point of the constituent element of the one of the electrodes may be lower than those of the other of the electrodes. In a case where both electrodes are directly exposed to the plasma P, due to the lower melting point and the lower boiling point of the constituent element of the one of the electrodes, the one of the electrodes may be melted and/or vaporized in comparison with the other of the electrodes.

For example, in a case where the Cu-based material is used as the composition material of the positive electrode 41 and the W-based material is used as the composition material of the negative electrode 42, a melting point and a boiling point of the metal element Cu contained in the Cu-based material are lower than those of the metal element W contained in the W-based material. Specifically, the melting point of Cu is 1085° C., and the boiling point of Cu is 2562° C. On the other hand, the melting point of W is 3422° C. and the boiling point of W is 5555° C. In a case where both electrodes are directly exposed to the plasma P, the lower melting point and the lower boiling point of the positive electrode 41 may make a melting and/or vaporization of the positive electrode 41 easier in comparison with the melting and/or vaporization of the negative electrode 42, the positive electrode 41 being made of the Cu-based material and the negative electrode 42 being made of W-based material. In light of the above matters, it is preferable that the adjunctive member 43 is located on the surface of the positive electrode 41 at the plasma P generation region. Due to the adjunctive member 43 on the surface of the positive electrode 41 at the plasma P generation region, it is suitably avoid a direct exposure of the positive electrode 41 made of the Cu-based material to the plasma P, the positive electrode 41 being located immediately below the adjunctive member 43, the Cu-based material being a material which is easy to be melted and/or vaporized.

In a case where the adjunctive member 43 is provided on the surface of the electrode having its constituent element of the lower melting point and the lower boiling point, for example, the surface of the positive electrode 41, the following technical effect can be achieved. Specifically, the adjunctive member 43 may make it possible to avoid a melting of the positive electrode 41 itself located immediately below the adjunctive member 43, which enables an entry of a melted material into the plasma P to be suitably avoided, the melted material being derived from the positive electrode 41. Accordingly, it is possible to prevent the melted material from serving as an impurity to the substrate 30, the melted being derived from the positive electrode 41. On the other hand, it can be considered that a part of the adjunctive member 43 may be melted by a direct exposure thereof to the plasma 43 and due to a property of the composition material of the adjunctive member 43. In this situation, a melted material derived from the adjunctive member 43 may enter the plasma P. This means that the melted material derived from the adjunctive member can function as an impurity to the substrate 30. Thus, in a presence of the plasma P, it is possible to supply the impurity as well as the carbon source at the same timing to the surface side of the substrate 30, the impurity being derived from the composition material of the adjunctive member 43, the carbon source being derived from the raw material gas 50X, which may contribute to the formation of the diamond semiconductor having the semiconductor characteristic.

As described above, in the case where the positive electrode 41 which is the component of the electrode part 40 has the tubular structure, the adjunctive member 43 having a tubular structure is located at a tip portion of an inner wall surface, the inner wall surface forming the internal space of the positive electrode 41 having the tubular structure. Since the plasma P generated at the tip portion of the electrode part 40 is in the extremely high temperature state, as the number of times the plasma P is generated increases, it may be not possible to continuously maintain a resistance of the positive electrode 41, the negative electrode 42 and the adjunctive member 43 to the plasma P, each of which is a component of the electrode part 40. In light of the above matters, it is desirable to adopt a structure in which the positive electrode 41, the negative electrode 42, and/or the adjunctive member 43 can be sequentially provided. In order to enable the sequential provision, it is desirable that the receiving part serving to receive a part of the tubular positive electrode 41 has a structure in which the tubular positive electrode 41 and the tubular adjunctive member 43 can be suitably provided, from a location region of the receiving part to that of the positive electrode 41 (i.e., from an upward direction to a downward direction), the tubular adjunctive member 43 being located at the tip portion of the inner wall surface of the positive electrode 41. In light of the above matters, in a case where it may be not possible to continuously maintain the resistance of the positive electrode 41, the negative electrode 42 and the adjunctive member 43 to the plasma P due to an increase of the number of times the plasma P is generated, it is possible to sequentially provide the positive electrode 41, the negative electrode 42, and/or the adjunctive member 43.

Furthermore, the above adjunctive member 43 may adopt the following embodiment.

According to an embodiment, the adjunctive member 43 may be an alloy member including a composition material of the positive electrode 41 and a composition material of the negative electrode 42.

As described above, a composition material of the adjunctive member 43 is not particularly limited as long as the adjunctive member 43 functions as at least the electrode-protective member at the plasma P generation region. As an example, the composition material of the adjunctive member 43 may be an alloy material including a composition material of the positive electrode 41 and a composition material of the negative electrode 42. Namely, the adjunctive member 43 may be the alloy member including the composition material of the positive electrode 41 and the composition material of the negative electrode 42.

As described above, the technical knowledge of the skilled person is that the melting point and the boiling point of the constituent element of the positive electrode are different from those of the negative electrode. For example, in the case where the melting point and boiling point of the constituent element of the positive electrode are lower than those of the negative electrode, it has been known that a melting point and a boiling point of the alloy member may tend to be generally lower than those of one of electrodes having relatively higher melting point and boiling point (e.g., the negative electrode composed of W), the above alloy member including a composition material of the positive electrode 41 and that of the negative electrode 42. In light of the tendency, in an atmosphere of the high temperature plasma P, the protection of the positive electrode 41 by the alloy member as the adjunctive member 43 enables the melting of the positive electrode 41 itself to be avoided. On the other hand, the alloy member and the negative electrode 42 are directly exposed to the plasma P. In light of the tendency, the alloy member may be melted in a comparison with the negative electrode 42 having the relatively higher melting point and boiling point, whereas the negative electrode 42 is less likely to be melted in a comparison with the alloy member or may not be melted at all.

In light of the above matters, due to the avoidance of the melting of the positive electrode 41 itself located immediately below the alloy member, it is possible to prevent a melted material derived from the positive electrode 41 from being supplied to the plasma P, which makes it possible to prevent the melted material from serving as an impurity to the substrate 30. On the other hand, the alloy member as the adjunctive member which is directly exposed to the plasma P may be partially melted due to its property. Thus, a melted material derived from the adjunctive member 43 is supplied into the plasma P to be able to function as an impurity to the substrate 30. As described above, since the negative electrode 42 is less likely to be melted or may not be melted at all, a melt material derived from the negative electrode 42 is less likely to be supplied into the plasma P to serve as an impurity to the substrate 30 in a comparison with the alloy member. Accordingly, a formation of the diamond semiconductor having the semiconductor characteristic may result from a supply of the impurity derived from the composition material of the adjunctive member 43 as well as that of the carbon source derived from the raw material gas 50X to the surface side of the substrate 30 at the same timing in the presence of the plasma P.

Taking a case where the positive electrode 41 is made of the Cu-based material and the negative electrode 42 is made of the W-based material as an example, the alloy member as the adjunctive member is made of a Cu—W-based material. In this case, it is more preferable that the alloy member directly exposed to the plasma P includes a relatively large amount of W having a higher melting point and a higher boiling point than Cu having a lower melting point and a lower boiling point at a metal element ratio from a viewpoint of a reduction of a degree of melting as much as possible. This is based on a technical knowledge of the skilled person that it is preferable to provide a small amount of an impurity corresponding to the melted material derived from the alloy member to suitably obtain a semiconductor, whereas it is not preferable to provide a large amount of the impurity.

EXAMPLES

A formation of a diamond film etc. was performed using the following device.

Example 1

(Configuration of Used Device for Forming Diamond Film Etc. 100)

Container 10:

The container 10 is composed of a cylinder quartz glass and a stainless steel flange. An airtightness of the container 10 is maintained by a silicon packing and O-ring. The container 10 is filled with a raw material liquid 20 and a carrier gas 60X (i.e., Ar gas).

Raw material liquid 20:

The raw material liquid is composed of methanol solution 97% by volume and ethanol solution having 3% by volume.

Substrate 30:

The substrate is a cemented carbide-substrate. The cemented carbide-substrate has a size of 8 mm×27 mm×0.5 mm, and is a sintered body obtained by mixing tungsten carbide (WC) and cobalt (Co) at a weight ratio of 5:1.

Positive electrode 41 as component of the electrode part 40:

The positive electrode 41 is a cylindrical Cu-based positive electrode having an internal diameter of 6.0 mm.

Negative electrode 42 as component of the electrode part 40:

The negative electrode 42 is a columnar W-based negative electrode having a diameter of 2.4 mm.

Adjunctive member 43 as component of the electrode part 40:

The adjunctive member 43 is a Cu—W based alloy member located at an end portion of the cylindrical Cu-based positive electrode, the Cu—W based alloy member having W of 84%, Cu of 14%, other metal etc. of 2% at a metal element ratio.

Raw material gas supply part 50:

The raw material gas supply part 50 is a pressure vessel serving to supply a raw material gas 50X, the raw material gas 50X being obtained by a heating of a mixed solution of a methanol solution of 97% by volume and an ethanol solution of 3% by volume to 170° C. and a subsequent vaporization of the mixed solution heated Carrier gas supply part 60:

The carrier gas supply part 60 is a cylinder serving to supply argon gas.

Power source 70:

The power source 70 is a direct current power source. The direct current power source is TIG welding machine MT-200WA, manufactured by Might Industry Co., Ltd. An input current of the power source 70 is 10 A.

Gas cooling part 80

Liquid tank 90

(Implementation steps)

(1) Firstly, the cemented carbide substrate having the size of 8 mm×27 mm×0.5 mm was disposed on a substrate holder in the container 10, and the container 10 having the disposed cemented carbide substrate therein was filled with a mixed solution composed of the methanol solution of 97% by volume and the ethanol solution of 3% by volume and the argon gas. A distance between the cemented carbide substrate and a tip portion 40X of the electrode part 40 was adjusted using a micrometer such that the tip portion 40X was positioned in the mixed solution and the distance was made 1.0 mm. The airtightness of the container 10 was maintained by the silicon packing and the O-ring. In addition, as a pretreatment of the cemented carbide substrate, a surface of the cemented carbide substrate was roughly processed with a sandpaper for 2 minutes, was ultrasonically polished with colloidal water for 30 minutes, the colloidal water being composed of methanol and diamond powders as a nucleus whose weight ratio was 5:1, and was also cleansed with methanol.

(2) Subsequently, an argon gas as a carrier gas 60X was supplied at 5 L/min to the internal space region of the electrode part 40, and a voltage was applied to the electrode part 40 using the direct current power source (TIG welding machine MT-200WA, manufactured by Might Industry Co., Ltd.) to generate a plasma P derived from the argon gas at the tip portion 40X as an arc discharge portion of the electrode part 40. Then, a heat treatment of the cemented carbide substrate was performed for 60 seconds with a plasma jet derived from the argon gas to increase a temperature of the substrate. The temperature of the cemented carbide substrate after the heating with argon gas plasma was 690 to 860° C. An infrared radiation thermometer was used as a thermometer.

(3) Subsequently, a raw material gas 50X derived from the mixed solution composed of the methanol solution of 97% by volume and the ethanol solution of 3% by volume was supplied at 5 L/min to the internal space region of the electrode part 40, and a voltage was applied to the electrode part 40 using the direct current power source (TIG welding machine MT-200WA, manufactured by Might Industry Co., Ltd.) to generate a plasma P derived from the raw material gas 50X at the tip portion 40X serving as the arc discharge portion of the electrode part 40.

(4) By irradiating the cemented carbide substrate with the generated plasma P for 260 seconds in total, a film formation was performed on the substrate for 200 seconds. At a point in time when the film formation was performed for 200 seconds, the film formation was not completed and there was in a process of the film formation. The film formation behavior was observed when a current output from the direct current power source was 12 A and a voltage was 19.8 to 24.0 v.

(Result)

Used Instruments

A quality of an obtained film was analyzed using the following instruments.

Scanning electron microscope (SEM) manufactured by JEOL Ltd./Product name: JSM-6060

Figure 5:
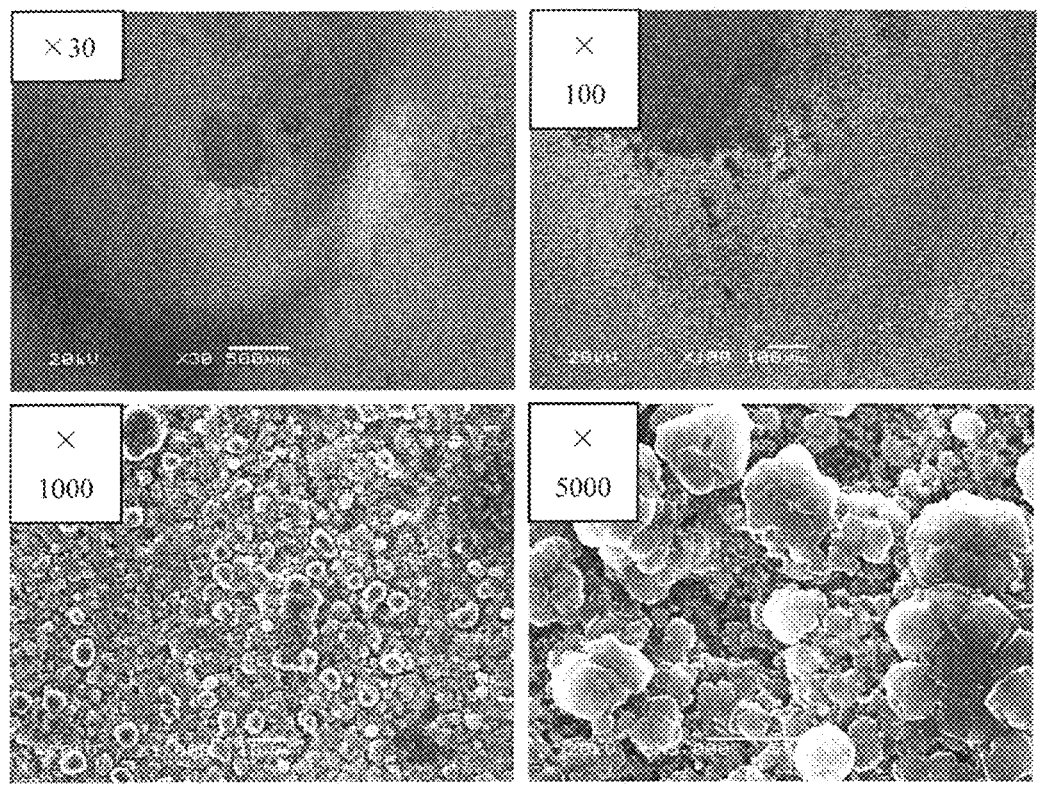
FIG. 5 is a SEM image of a diamond crystal formed on a surface of a cemented carbide alloy substrate.
Figure 6:
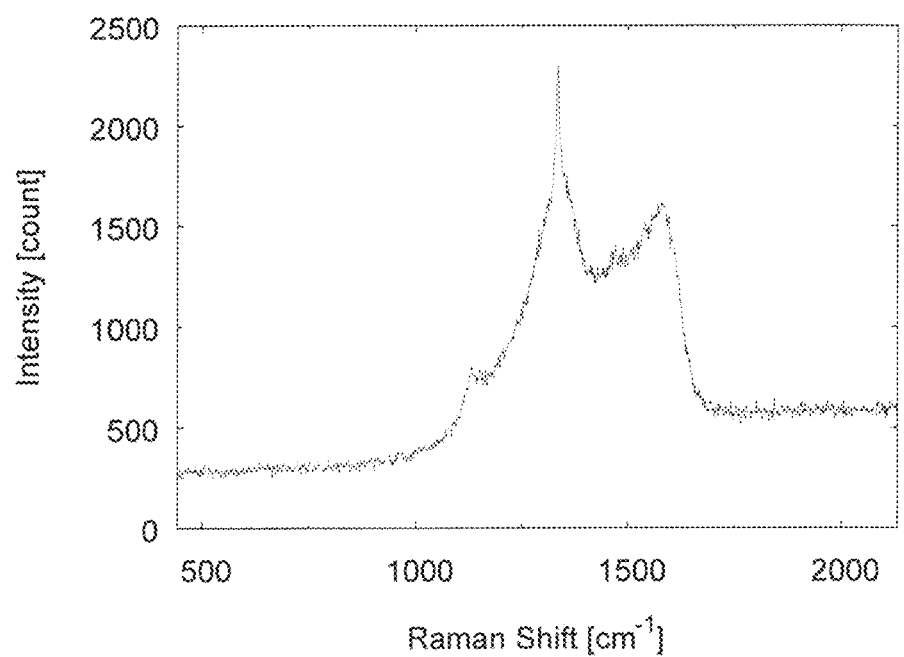
FIG. 6 is a Raman spectrum of a diamond crystal formed on a surface of a cemented carbide alloy substrate.
Figure 7:
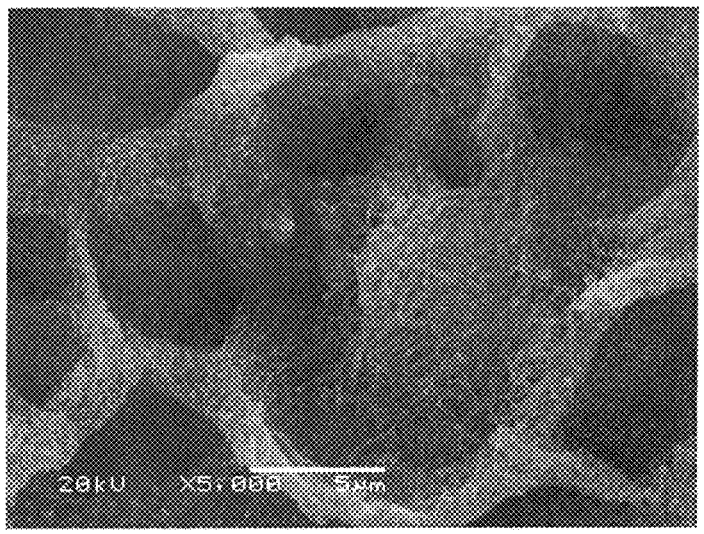
FIG. 7 is a SEM image of a carbon nanotube (CNT) formed on a surface of a cemented carbide alloy substrate.

Micro Raman spectroscopic analyzer manufactured by RENISHAW/Product name: in ViaReflex with excitation light of 150 mW, spot diameter of 1.4 μm, and YAG laser wavelength of 532 nm The analytic results are shown in FIGS. 5 to 7.

As shown in FIG. 5 (i.e., SEM image of the cemented carbide substrate-surface), a precipitation of a diamond crystal in the process of the film formation was observed. It was observed that a surface of the diamond crystal had a concavo-convex in a wide range. Furthermore, as shown in FIG. 6 (i.e., Raman spectrum of the cemented carbide substrate-surface) with its vertical axis of Intensity [count] and its horizontal axis of Raman Shift [$cm^{-1}$], a sharp peak derived from $sp^3$ bond of diamond was observed near 1332 $cm^{-1}$. The crystal had a characteristic configuration that the crystal was obtained by a spiral growing (i.e., a growing with a spiral dislocation) of single crystals having a polyhedral structure as a whole (see the SEM image by 5000 times of the surface of the cemented carbide substrate in the lower right of FIG. 5).

Furthermore, as shown in FIG. 7 (i.e., SEM image of the surface of the cemented carbide substrate), a fibrous compound considered to be a carbon nanotube (CNT) was observed at another point on the surface of the cemented carbide substrate.

It has been known that the carbon nanotube (CNT) can be synthesized using Co particle as a catalyst. In light of the above matters, due to an inclusion of Co in the cemented carbide substrate as the substrate 30, it was conceivable that, upon an irradiation of the cemented carbide substrate with the plasma P, Co was dissolved from the cemented carbide substrate and the dissolved Co was changed into Co in a particle state, and then the carbon nanotube (CNT) was formed from the carbon source derived from the raw material gas 50X extracted by the plasma P using the Co as a catalyst.

Example 2

(Configuration of Used Device for Forming Diamond Film 100)

Example 2 is different from Example 1 as to the following point. The following Si substrate was used as the substrate 30. Overlap portions of descriptions are omitted since other components other than the substrate have the same conditions as those of the Example 1.

Substrate 30: Si substrate having a size of 8 mm×27 mm×0.5 mm (Implementation Steps)

Overlap portions of descriptions will be omitted since the steps are substantially the same as the steps performed in the Example 1 except of the use of the Si substrate as the substrate 30.

(1) Firstly, the Si substrate having the size of 8 mm×27 mm×0.5 mm was disposed on a substrate holder in the container 10, and the container 10 having the disposed Si substrate therein was filled with a mixed solution composed of the methanol solution of 97% by volume and the ethanol solution of 3% by volume and the argon gas. A distance between the Si substrate and a tip portion 40X of the electrode part 40 was adjusted using a micrometer such that the tip portion 40X was positioned in the mixed solution and the distance was made 1.5 mm. The Si substrate was pretreated in the same manner as that of Example 1.

(2) Subsequently, a plasma P derived from the argon gas was generated and then a heat treatment of the Si substrate was performed for 60 seconds with a plasma jet derived from the argon gas to increase a temperature of the substrate. The temperature of the Si substrate after the heating with argon gas plasma was 680 to 750° C.

(3) Subsequently, a raw material gas 50X derived from the mixed solution composed of the methanol solution of 97% by volume and the ethanol solution of 3% by volume was supplied at 5 L/min to the internal space region of the electrode part 40, and then a plasma P derived from the raw material gas 50X was generated using the direct current power source.

(4) By irradiating the Si substrate with the generated plasma P for 360 seconds, a film formation was performed on the substrate for 300 seconds. At a point in time when the film formation was performed for 300 seconds, the film formation was not completed and there was in a process of the film formation. The film formation behavior was observed when a current output from the direct current power source was 12 A and a voltage was 24.4 to 28.9 v (Average voltage: 26.7 v, average output: 319.8 W).

(Result)

Used Instruments

A quality of an obtained film was analyzed using the scanning electron microscope (SEM) and the micro Raman spectroscopic analyzer as used in Example 1.

Figure 8:
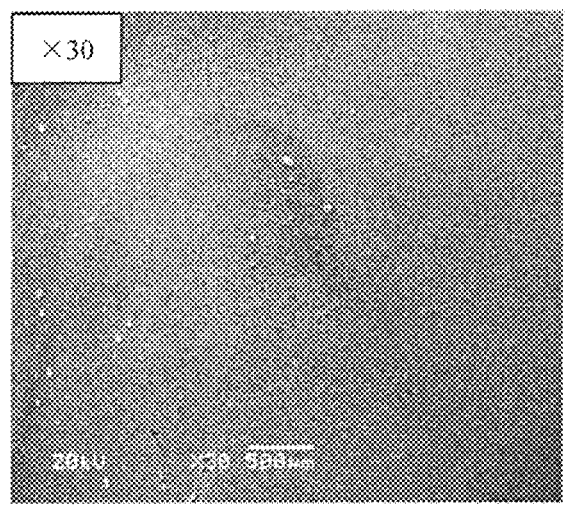
FIG. 8 is a SEM image of a diamond crystal formed on a surface of a Si substrate.
Figure 8:
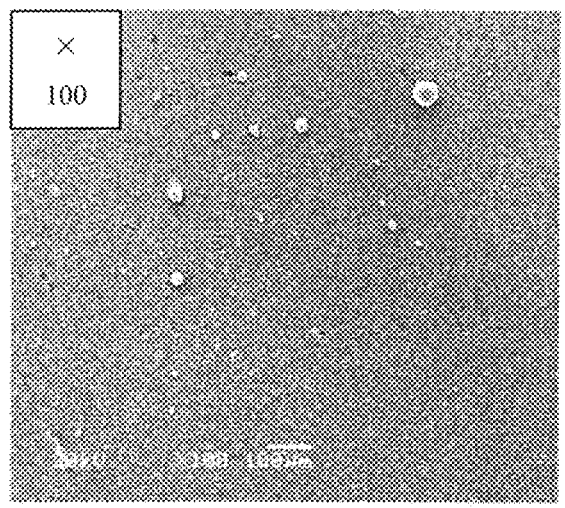
Figure 8:
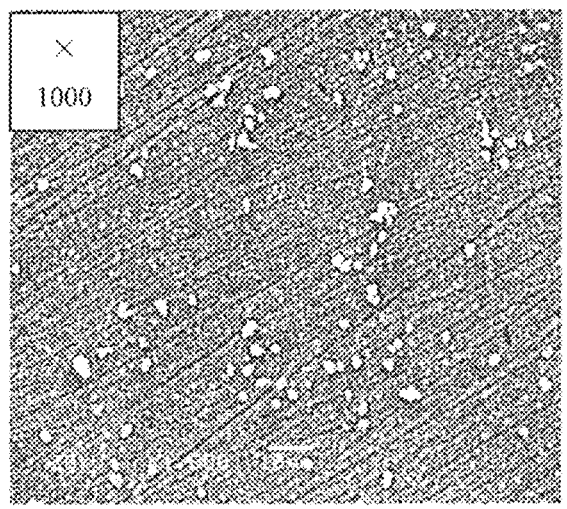
Figure 8:
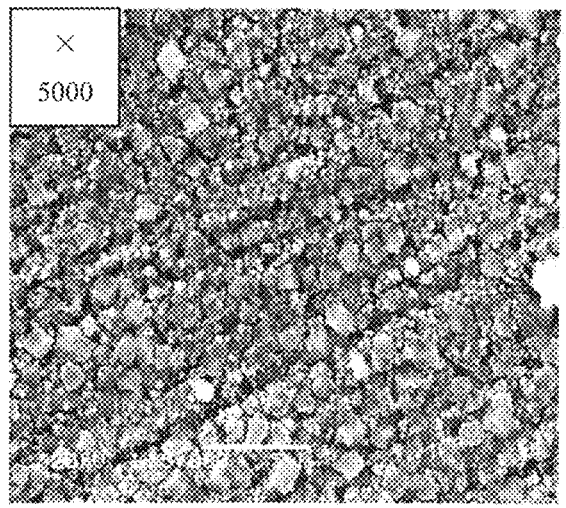
Figure 9:
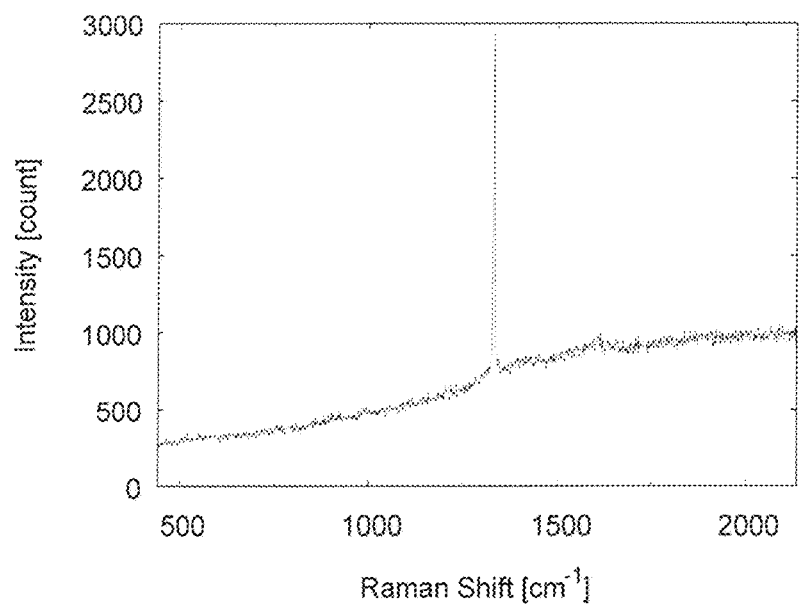
FIG. 9 is a Raman spectrum of a diamond crystal formed on a surface of a Si substrate.

The analytic results are shown in FIGS. 8 and 9.

As shown in FIG. 8 (i.e., SEM image of the Si substrate-surface), a precipitation of a diamond crystal in the process of the film formation was observed. It was observed that a surface of the diamond crystal had a concavo-convex in a wide range. Furthermore, as shown in FIG. 9 (i.e., Raman spectrum of the Si substrate-surface) with its vertical axis of Intensity [count] and its horizontal axis of Raman Shift [cm$^{-1}$], a sharp peak derived from sp$^3$ bond of diamond was observed near 1332 cm$^{-1}$. In light of the above matters, it was found that a formation of a diamond crystal was possible if the carbon source derived from the raw material gas was supplied even if the Si substrate had no carbon source. A monocrystal had a substantially cubic structure as compared with a normal structure of a hexahedron or the like. Furthermore, it was found that the monocrystal in Example 2 had a remarkable substantially cubic structure compared with that in Example 1 which is the case of the use of the cemented carbide substrate as the substrate 30 (see the SEM image by 5000 times of the surface of the cemented carbide substrate in the lower right of FIG. 5 and also the SEM image by 5000 times of the surface of the Si substrate in the lower right of FIG. 8). Namely, it may be considered to be preferable to use the Si substrate rather than the cemented carbide substrate as the substrate 30 to obtain the diamond crystal having the substantially cubic structure more preferably.

Example 3

Overlap portions of descriptions are omitted since the Example 3 has the almost same conditions as those of the Example 2. Differences are as follows.

The temperature of the Si substrate after heating with the argon gas plasma in the above step (2) was 710 to 940° C.

The step of the film formation was performed for 134 seconds on the Si substrate in the above step (4). At a point in time when the film formation was performed for 134 seconds, the film formation was not completed and there was in a process of the film formation. The film formation behavior was observed when a current output from the direct current power source was 12 A and a voltage was 16.2 to 22.4 v (Average voltage: 19.3 v, average output: 231.6 W).

(Result)

Used Instruments

A quality of an obtained film was analyzed using the scanning electron microscope (SEM) and the micro Raman spectroscopic analyzer as used in Examples 1 and 2.

Figure 10:
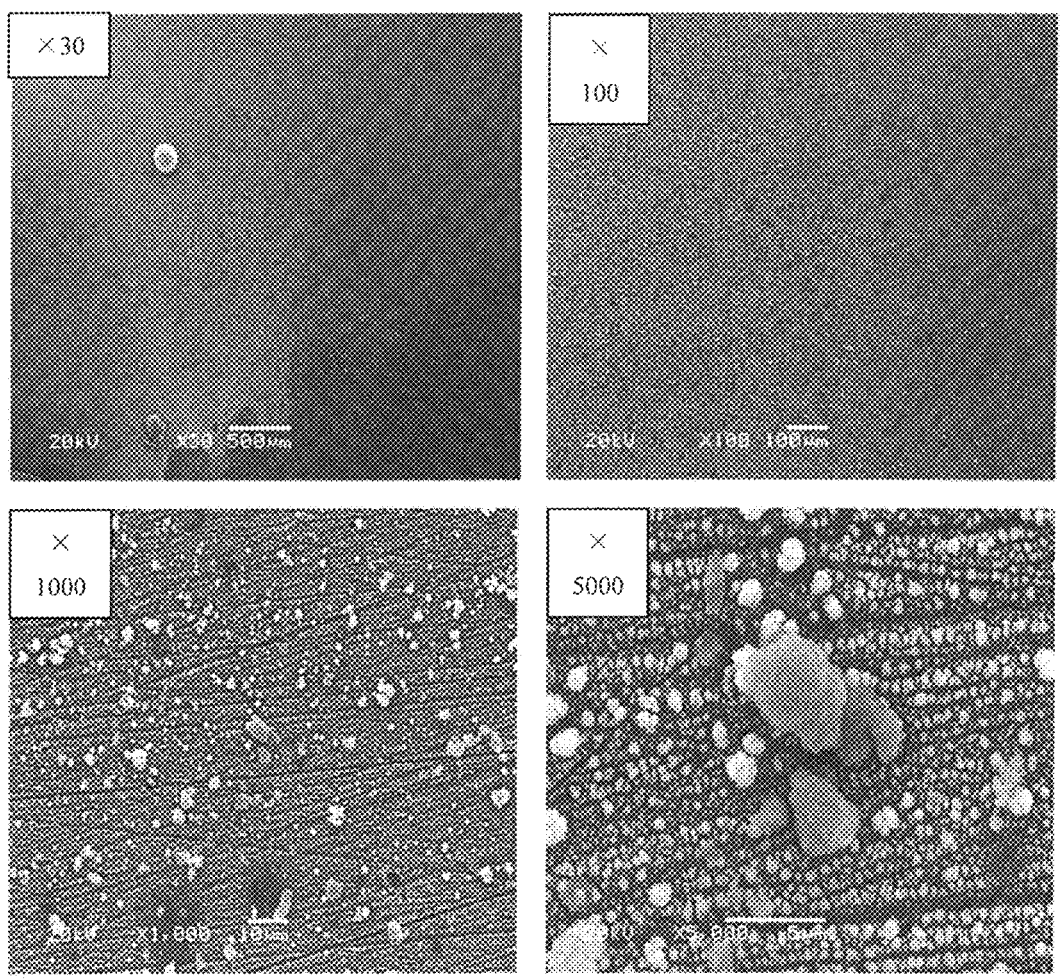
FIG. 10 is a SEM image of a diamond crystal formed on a surface of a Si substrate.
Figure 11:
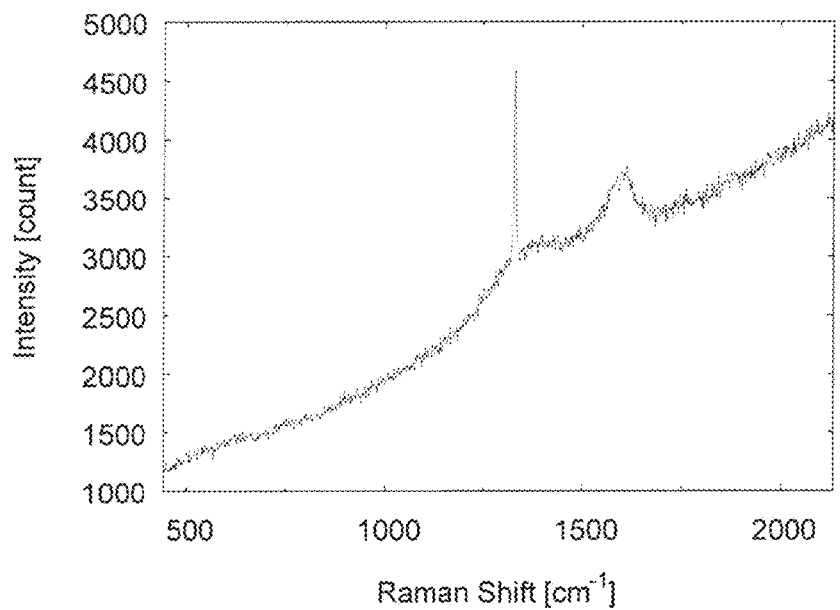
FIG. 11 is a Raman spectrum of a diamond crystal formed on a surface of a Si substrate.

The analytic results are shown in FIGS. 10 and 11.

As shown in FIG. 10 (i.e., SEM image of the Si substrate-surface), a precipitation of a diamond crystal in the process of the film formation was observed. It was observed that a surface of the diamond crystal had a concavo-convex in a wide range. Furthermore, as shown in FIG. 11 (i.e., Raman spectrum of the Si substrate-surface) with its vertical axis of Intensity [count] and its horizontal axis of Raman Shift [cm$^{-1}$], a sharp peak derived from sp$^3$ bond of diamond was observed near 1332 cm$^{-1}$. In light of the above matters, it was found that a formation of a diamond crystal was possible if the carbon source derived from the raw material gas was supplied even if the Si substrate had no carbon source.

Example 4

Overlap portions of descriptions are omitted since the Example 4 has the almost same conditions as those of the Example 2. Differences are as follows.

The temperature of the Si substrate after heating with the argon gas plasma in the above step (2) was 670 to 740° C.

By irradiating the Si substrate with the generated plasma P for 200 seconds in the above step (4), the step of the film formation was performed. The film formation behavior was observed when a current output from the direct current power source was 22 A, an input current was 20 A, and a voltage was 19.4 to 23.2 v (Average voltage: 21.3 v, average output: 468.6 W).

(Result)
Used Instruments
A quality of an obtained film was analyzed using the scanning electron microscope (SEM) and the micro Raman spectroscopic analyzer as used in Examples 1 to 3.

Figure 12:
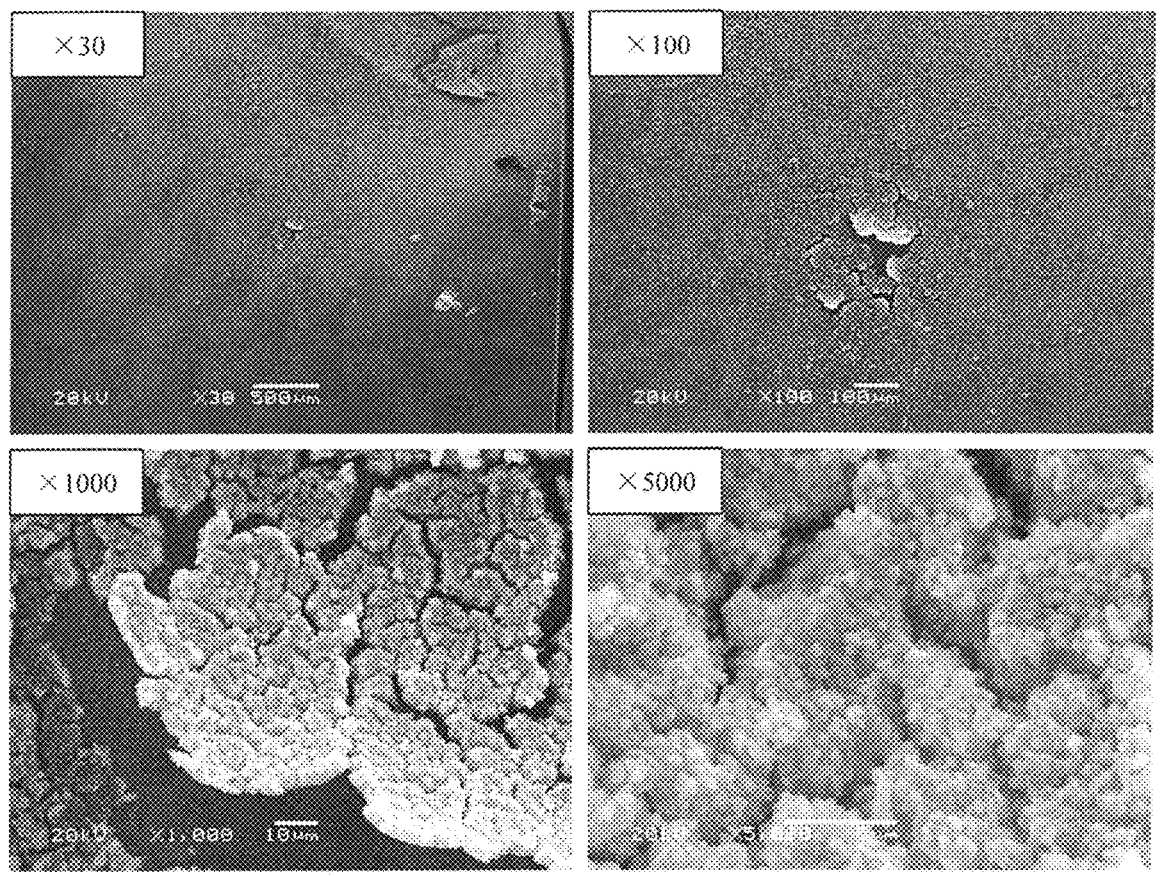
FIG. 12 is a SEM image of a diamond crystal formed on a surface of a Si substrate.
Figure 13:
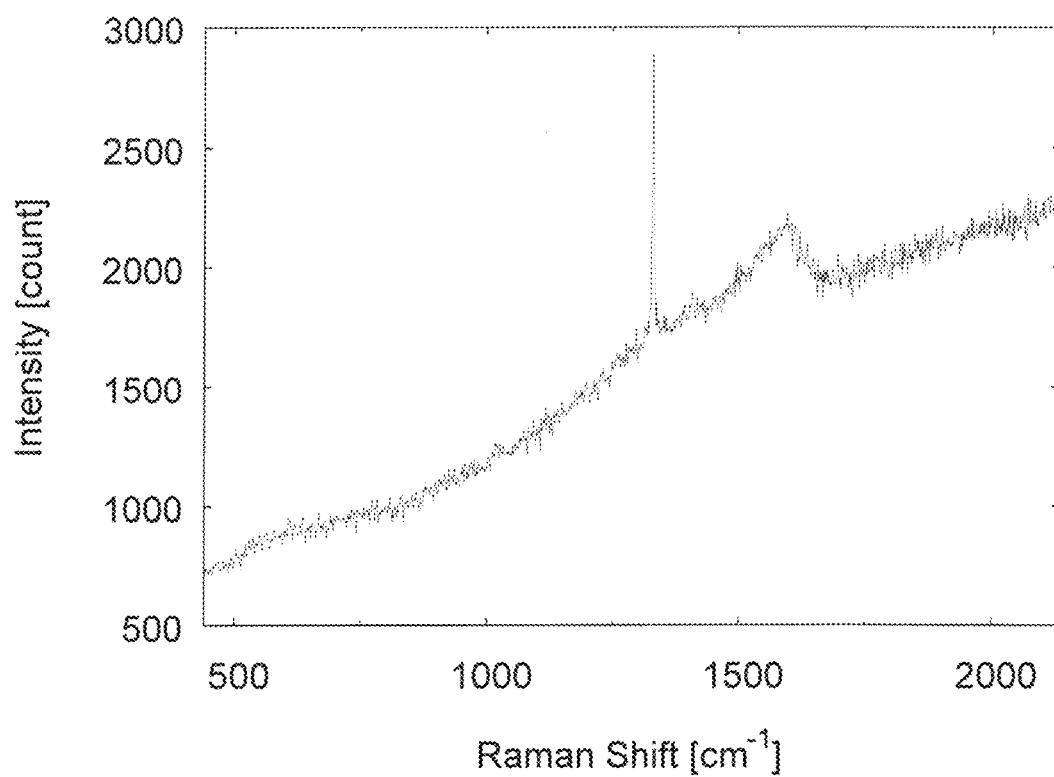
FIG. 13 is a Raman spectrum of a diamond crystal formed on a surface of a Si substrate.

The analytic results are shown in FIGS. 12 and 13.

As shown in FIG. 13 (i.e., Raman spectrum of the Si substrate-surface) with its vertical axis of Intensity [count] and its horizontal axis of Raman Shift [cm$^{-1}$], a sharp peak derived from sp$^3$ bond of diamond was observed near 1332 cm$^{-1}$. In light of the above matters, it was found that a formation of a diamond crystal was possible if the carbon source derived from the raw material gas was supplied even if the Si substrate had no carbon source. As shown in FIG. 12 (i.e., SEM image of the Si substrate-surface), particularly as shown in the SEM image by 5000 times of the surface of the Si substrate in the lower right of FIG. 12, a precipitation of a diamond crystal in the process of the film formation was observed. More specifically, it was found that the diamond crystal (i.e., a polycrystal) was a stack in a shape of a brick, the stack having a plurality of monocrystals having a cubic shape. Thus, it was found that, due to the stack in the shape of the brick, a whole structure of the polycrystal and a structure of the monocrystal had a pseudo (i.e., similar or homothetic) relationship with each other.

When the structure of the polycrystal and the structure of the monocrystal have the pseudo (i.e., similar or homothetic) relationship, it is conceivable that the polycrystal can be converted into the monocrystal by slightly heating the polycrystal, thereby inducing an atomic diffusion at a grain boundary region of a crystal. It has been known according to the technical common knowledge of the skilled person that a polycrystalline semiconductor do not generally have a good device efficiency, whereas a monocrystalline semiconductor generally has a good device efficiency. In view of the above matters, in a case where the diamond film may functions as a diamond semiconductor, a conversion into the monocrystal is essential to use the diamond semiconductor as a variety of devices. Accordingly, it is considered that the fact that "the structure of the polycrystal and the structure of the monocrystal have the pseudo (i.e., similar or homothetic) relationship" may be effective to use the diamond film (i.e., the diamond semiconductor) as a variety of devices, the pseudo relationship enabling the conversion into the monocrystal.

As described above, Examples 1 to 4 have been described. In the Examples 1 to 4, the electrode part 40 with the alloy member as the adjunctive member 43 was used, the alloy member including the composition material of the positive electrode 41 and the composition material of the negative electrode 42. Specifically, the Cu—W based alloy member was used, the Cu—W based alloy member having its metal element ratio of W of 84%, Cu of 14% and other metal, etc. of 2%, and also being disposed at the end portion of the cylindrical Cu based positive electrode.

According to the above configuration, it is possible to avoid a melting of the positive electrode 41 itself located immediately below the alloy member, which makes it possible to prevent a melted material derived from the positive electrode 41 from being supplied into the plasma P. On the other hand, the alloy member and the negative electrode 42 optionally is or are directly exposed to the plasma P, which may cause the alloy member and the negative electrode 42 optionally to be partially melted. Thus, a melted material derived from the alloy member and the negative electrode 42 optionally is supplied into the plasma P to be able to function as an impurity to the substrate 30. Furthermore, since a melting point and a boiling point of W as a constituent element of the negative electrode 42 are much higher than those of Cu as a constituent element of the positive electrode 41, the negative electrode 42 may be less likely to be melted or may not be melted at all in the high temperature plasma. Thus, a melted material derived from the negative electrode 42 is less likely to be supplied into the plasma P to serve as an impurity to the substrate 30 in a comparison with a case of an use of the alloy member. As a result, the impurity derived from the composition material of the alloy member as well as the carbon source derived from the raw material gas 50X may be supplied to the surface side of the substrate 30 at the same timing in the presence of the plasma P. Accordingly, the diamond semiconductor having the semiconductor characteristic may be formed.

The used Cu—W based alloy member contained W of 84% and Cu of 14% at the metal element ratio. That is, the used Cu—W based alloy member contained a relatively large amount of W having the higher melting point and the higher boiling point as compared with Cu having the lower melting point and the lower boiling point in the metal element. It is generally preferable to provide a small amount of an impurity to suitably obtain a semiconductor, whereas it is not preferable to provide a large amount of the impurity. In light of the above matters, when the Cu—W based alloy member contains a relatively large amount of W having the higher melting point and the higher boiling point as compared with Cu having the lower melting point and the lower boiling point in the metal element, it is make a degree of the melting of the Cu—W alloy member relatively lower, the Cu—W alloy member being directly exposed to the high-temperature plasma, which may enable an amount of an impurity derived from the composition material of the alloy member to be reduced.

Although some embodiments of the present invention have been hereinbefore described, these are merely typical examples in the scope of the present invention. Accordingly, the present invention is not limited to the above embodiments. It will be readily appreciated by the skilled person that various modifications are possible without departing from the scope of the present invention.

INDUSTRIAL APPLICABILITY

According to the present invention, the diamond film obtained may be a diamond semiconductor film. In this case, the diamond semiconductor film can be used for airplanes, ships, artificial satellites, rockets, etc. due to its property.

CROSS REFERENCE TO RELATED PATENT APPLICATION

The present application claims the right of priority of Japanese Patent Application No. 2017-253939 (filed on Dec. 28, 2017, the title of the invention: "DEVICE FOR FORMING DIAMOND FILM ETC. AND METHOD THEREFOR"), the disclosure of which is incorporated herein by reference.

EXPLANATION OF REFERENCE NUMERALS

100 Device for forming diamond film, etc.
10 Container
20, 20' Raw material liquid
30, 30' Substrate
40 Electrode part
40X Tip portion of Electrode part
41 Positive electrode
41X Internal space region of Positive electrode
42 Negative electrode
43 Adjunctive member (or Additional member)
43X Attachment member
43Y Electrode melting prevention member
43Z Impurity supply source member
50 Raw material gas supply part
50X Raw material gas
60 Carrier gas supply part
60X Carrier gas
70 Power source (or Power supply)
70' High frequency power source
71 Direct current power source
80 Gas cooling part
90 Liquid tank
P, P' Plasma

The invention claimed is:

1. A device for forming at least a diamond film on a surface of a substrate, the device comprising:
a container configured to hold a raw material liquid and to place the substrate in the raw material liquid;
an electrode part comprising a positive electrode and a negative electrode and configured to generate a plasma in the raw material liquid;
a raw material gas supply part and a carrier gas supply part, each of the raw material gas supply part and the carrier gas supply part being connected to the electrode part,
wherein a raw material gas comprising at least a carbon source for forming the at least one diamond film on the surface of the substrate is provided by the raw material gas supply part; and
a power source configured to apply a voltage to the electrode part,
wherein the power source is a direct current power source, and the electrode part further comprises an adjunctive member, and the adjunctive member is attached to an electrode at a plasma generation region of the electrode part, and
wherein a part of the adjunctive member is melted to be an impurity supply source member at the plasma generation region.

2. The device according to claim 1, wherein the adjunctive member is a melting prevention member for the electrode at the plasma generation region.

3. The device according to claim 1, wherein the adjunctive member is located at a tip portion of the electrode part generating the plasma.

4. The device according to claim 1, wherein the adjunctive member is located on a surface of the positive electrode at the plasma generation region.

5. The device according to claim 1, wherein the adjunctive member is an alloy member comprising a composition material of the positive electrode and a composition material of the negative electrode.

6. The device according to claim 1, wherein the positive electrode has a tubular structure having an internal space region, the negative electrode extends into the internal space region of the positive electrode, and wherein the plasma generation region is provided between the positive electrode and the negative electrode extending into the internal space region of the positive electrode.

7. The device according to claim 1, wherein the positive electrode is made of a Cu based material, the negative electrode is made of a W based material, and the adjunctive member is made of a Cu—W based material.

8. The device according to claim 7, wherein the adjunctive member comprises a relatively larger amount of W than Cu in a metal element ratio.

9. The device according to claim 1, wherein the electrode part is positioned vertically above the substrate such that the electrode part and the substrate are opposed to each other.

10. A method for forming at least a diamond film on a surface of a substrate, the method comprising:
placing the substrate in a container and holding a raw material liquid in the container in which the substrate is placed,
supplying a raw material gas and a carrier gas into an electrode part, the electrode part comprising a positive electrode and a negative electrode and a tip portion of the electrode part being located in the raw material liquid, the raw material gas comprising at least a carbon source for forming the at least one diamond film on the surface of the substrate; and
applying a voltage to the electrode part by a power source to generate a plasma at the tip portion of the electrode part,
wherein a direct current power source is used as the power source, the electrode part further comprising an adjunctive member, and the adjunctive member is attached to an electrode at a plasma generation region of the electrode part, and
wherein a part of the adjunctive member is melted to be an impurity supply source member at the plasma generation region.

11. The method according to claim 10, wherein the adjunctive member is a melting prevention member for the electrode at the plasma generation region.

12. The method according to claim 10, wherein the adjunctive member is located at a tip portion of the electrode part generating the plasma.

13. The method according to claim 10, wherein the adjunctive member is located on a surface of the positive electrode at the plasma generation region.

14. The method according to claim 10, wherein an alloy member is used as the adjunctive member, the alloy member comprising a composition material of the positive electrode and a composition material of the negative electrode.

15. The method according to claim 10, wherein an electrode made of a Cu based material is used as the positive electrode, an electrode made of a W based material is used as the negative electrode, and a member made of a Cu—W based material is used as the adjunctive member.

16. The method according to claim 15, wherein a member comprising a relatively larger amount of W than Cu in a metal element ratio is used as the adjunctive member.

17. The method according to claim 10, wherein each of a first plasma generated using the carrier gas and a second plasma generated using the raw material gas is supplied from the plasma generation region to the substrate, and the first plasma is supplied to the substrate before a supply of the second plasma thereto.

18. The method according to claim 10, wherein the electrode part is positioned vertically above the substrate such that the electrode part and the substrate are opposed to each other, wherein a carbon nanotube is further formed on the surface of the substrate in addition to a formation of the diamond film thereon.

\* \* \* \* \*